United States Patent
Rusli

(10) Patent No.: US 7,098,143 B2
(45) Date of Patent: Aug. 29, 2006

(54) ETCHING METHOD USING AN AT LEAST SEMI-SOLID MEDIA

(75) Inventor: Darwin Rusli, Sugar land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 150 days.

(21) Appl. No.: 10/831,013

(22) Filed: Apr. 22, 2004

(65) Prior Publication Data

US 2004/0242018 A1 Dec. 2, 2004

Related U.S. Application Data

(60) Provisional application No. 60/465,919, filed on Apr. 25, 2003.

(51) Int. Cl.
*H01L 21/302* (2006.01)

(52) U.S. Cl. ............... 438/734; 438/735; 438/977; 257/E21.214; 216/2; 216/83; 216/95; 216/109

(58) Field of Classification Search ............... 438/734, 438/735, 977, FOR. 100, FOR. 128, FOR. 108; 257/E21.214; 216/2, 83, 95, 109
See application file for complete search history.

(56) References Cited

U.S. PATENT DOCUMENTS

| | | | |
|---|---|---|---|
| 6,375,693 B1 * | 4/2002 | Cote et al. | 51/308 |
| 6,521,574 B1 * | 2/2003 | Hirabayashi et al. | 510/175 |
| 6,951,812 B1 * | 10/2005 | Jiang et al. | 438/643 |
| 2004/0023413 A1 * | 2/2004 | Opalsky | 436/518 |

\* cited by examiner

*Primary Examiner*—George Fourson
*Assistant Examiner*—Thanh V. Pham
(74) *Attorney, Agent, or Firm*—Jacqueline J. Garner; W. James Brady, III; Frederick J. Telecky, Jr.

(57) ABSTRACT

An etching method that uses an etch reactant retained within at least a semi-solid media (120, 220, 224, 230). The etch reactant media is applied to selectively etch a surface layer (106, 218, 222). The etch reactant media may be applied to remove metal shorts (222), smearing and eaves resulting from CMP or in failure analysis for uniform removal of a metal layer (218) without damaging the vias, contact, or underlying structures.

20 Claims, 5 Drawing Sheets

ETCHING METHOD USING AN AT LEAST SEMI-SOLID MEDIA

This application claims priority under 35 USC § 119(e)(1) of provisional application number 60/465,919 filed Apr. 25, 2003.

FIELD OF THE INVENTION

The invention is generally related to the field of etching materials in semiconductor devices and more specifically to an etching process in which the etch reactant is retained within a solid or semi-solid media.

BACKGROUND OF THE INVENTION

Semiconductor devices typically contain several levels of metal interconnect to connect various elements, such as transistors, capacitors and resistors, to each other. A level of metal interconnect is connected to other levels of metal interconnect through conductive vias. Traditionally, the metal interconnects comprised an aluminum alloy along with barrier layers and the conductive vias comprised tungsten.

However, copper interconnects are replacing the traditional aluminum interconnects. Copper interconnects are being formed using dual damascene processes in which the dielectrics are formed first. A trench is etched in an intrametal dielectric (IMD) for the interconnect lines. A via may be etched in an underlying interlevel dielectric (ILD). The trench and any vias are then both filled with copper using the same process. A barrier layer is deposited followed by a copper seed layer. Electrochemical deposition (ECD) is then used to fill the trench and vias with copper. The ECD process overfills the trench and the excess copper is removed by CMP.

It is sometimes desirable to remove a copper interconnect level without damaging the underlying structure (e.g., the IMD, ILD, vias, contacts). This is typically desired during failure analysis (FA) of a semiconductor device.

Traditional wet etching techniques can not be applied to selectively delayer copper interconnect levels. In older technologies using aluminum interconnects, the vias are typically tungsten plugs which are available to act as an etch stop. (Although, if the tungsten plugs did not hold up the underlying Al would be etched. perhaps loosing the defect.) However, in copper interconnects, the conductive vias comprise the same materials as the interconnect lines (i.e., copper and barrier layers) and therefore cannot serve as an etch stop.

Currently, the only available tools for selective delayering of copper interconnects are parallel polishing and plasma etching. These processes are painstaking and very time consuming. Lapping is a manual process normally. There is no real way to understand how much material has been lapped so the analyst must constantly inspect the sample. The layers are now so thin that the inspection must be performed on an SEM. Loading, inspection and unloading is time consuming. The SEM is a costly tool. Automated lapping procedures are currently difficult to setup. They suffer from the same problem as manual lapping when it comes to inspection of the layers being removed. In addition, there is no etch stop for lapping. Plasma etching does have some laser end point detection but for processed die the endpoint detection is subject to interpretation. An analyst must still inspect the device to see if the correct surface has been removed to the proper depth.

SUMMARY OF THE INVENTION

The invention is an etching method that uses an etch reactant retained within at least a semi-solid media. Retaining the reactant in at least a semi-solid media allows for increased control of the reactant volume at the surface, rate of etching, and diffusion of reactant through cracks/contact/vias.

These and other advantages will be apparent to those of ordinary skill in the art having reference to the specification in conjunction with the drawings.

DETAILED DESCRIPTION OF THE EMBODIMENTS

Figure 1:
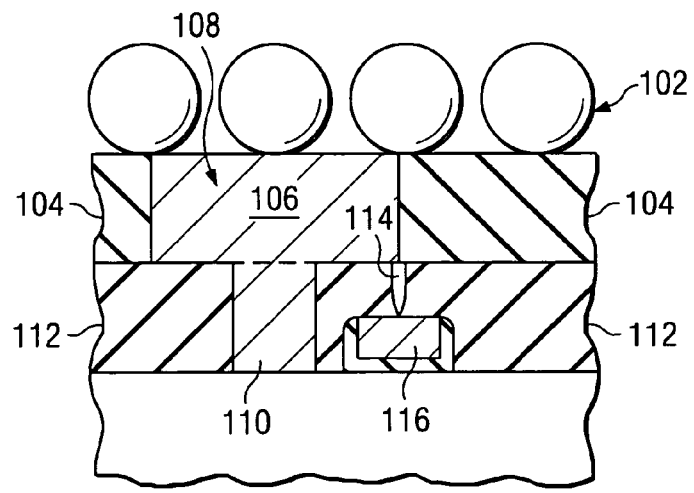
FIGS. 1 and 2 are cross-sectional diagrams of an embodiment of the invention at various stages of fabrication.

The invention is an etching method in which the etch reactant is retained within at least a semi-solid media. The term "at least a semi-solid media" refers to a non-liquid, non-gas media that is either semi-solid (e.g., a gel) or solid. The etch reactant itself may be liquid or gas, but it is retained within at least a semi-solid media.

By retaining the etch reactant within at least a semi-solid media, several advantages are achieved. The volume of the reactant at the surface may be more easily controlled by selecting the physical characteristics of the media. The surface tension is likewise controlled by the at least semi-solid media rather than the etch reactant. Finally, the diffusion of reactant through cracks, contacts, and vias may be prevented. Where gas and liquid reactants can easily extend into cracks, contacts, and vias, the semi-solid media (and thus the etch reactant retained therein) can be selected so as to not extend into cracks, contacts, and vias.

As described herein, the etching method of the invention is applied to a semiconductor wafer or singulated die. It will be apparent to those of ordinary skill in the art that in invention may be applied to a variety of other etching applications in which it is desirable to selectively remove a material at a surface of a structure.

In one embodiment of the invention, the at least semi-solid material comprises an agar solution. An agar powder may be mixed with de-ionized (DI) water, boiled and then cooled to form a gel. The gel is then diced into small pieces. The gel pieces are then exposed to the etch reactant. If the etch reactant is liquid, for example, the gel pieces may be submerged in the etch reactant such that the reactant is adsorbed into the gel. The gel pieces with expand and retain the etch reactant. The size of the pieces is determined by the application. For example, if vias are present and not to be etched, the size of the gel piece is chosen to be 2 to 5 times the size of the via once the etch reactant is retained therein.

In the case of a solid media, the solid media may likewise diced into appropriate sized pieces. The solid pieces may then be submerged in a liquid etch reactant. If a zeolite or a porous poly propylene bead is used, the reactant is retained in the pores of the material.

In the case of a gas reactant, a porous material which is capable of holding a reactive gas may be used. For example, a polypro bead could be used to hold the $XeF_2$, which is a solid. Under slight heating the fluorine would evolve. The fluorine would then etch the Si or SiO2. However, it is expected that a reactive gas would be more difficult to control than a gel. The gel is soft so the particle size is some what in material. The gel conforms to the surface to some extent. This allows for a slight etch below the surface of a non etching material, i.e., Cu embedded in an oxide. However the depth below the surface is controllable.

The etch reactant may comprise standard etch chemicals used routinely in semiconductor fabrication. One exemplary etch reactant for etching copper comprises two parts ammonium hydroxide, two parts hydrogen peroxide, and one part DI water. The selectivity between different types of materials is determined by the selection of etch reactant. Various selective etch chemistries are known in the art.

Figure 2:
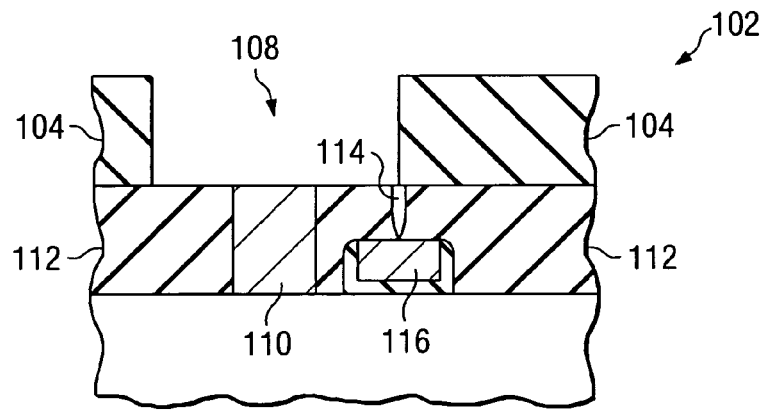

Once the etch reactant has been retained in the at least semi-solid media, the media is applied to the surface of a semiconductor body. The semiconductor body may, for example, be in wafer form or a singulated die. The desired layer is selectively and controllably etched. For example, FIG. 1 shows a media with etch reactant 120 applied to the surface of a semiconductor body 102. Semiconductor body 102 comprises a first layer 104 and a second, different, layer 106. Portions of layer 106 extend into a trench 108 in layer 104. Below layer 106, a contact 110 extends through layer 112. Semiconductor body 102 also includes a crack 114 extending from a corner of trench 108 to gate electrode 116. The etch reactant is chosen to be selective to etching layer 106 and against etching layer 104 and the size of the media 102 is chosen such that the media will not extend into crack 114. In addition, if the etch reactant will also significantly etch the material of contact 110, the size of the media should be chosen such that it will not extend into contact 110. The etch will continue as layer 106 is removed from areas over layer 104 and as layer 106 is removed from the trench 108 in layer 104. However, the etch reactant will not extend into crack 114. Either the selectivity of the etch reactant or the size of the media (or both) prevents the removal of contact 110. The media 120 is then removed. The result of the etch is shown in FIG. 2. Layer 106 has been selectively and controllably etched.

An embodiment of the invention will now be described in conjunction with a copper etching method. It will be apparent to those of ordinary skill in the art that the benefits of the invention may be applied to other materials and other etching applications in which layer by layer removal is desired or selective delayering is desired.

Figure 3:
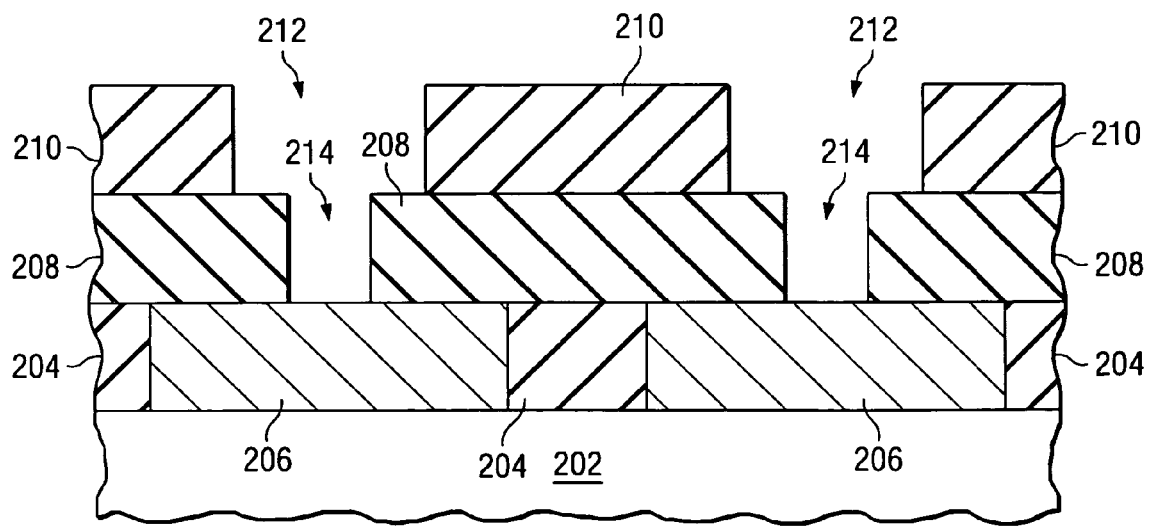
FIGS. 3–6 are cross-sectional diagrams of one aspect of a copper embodiment of the invention at various stages of fabrication.

FIG. 3 shows a partially processed integrated circuit 200. Semiconductor body 202 typically comprises a silicon substrate with or without epitaxial layers formed thereon. Other suitable substrates, such as silicon-on-insulator, are known in the art. Semiconductor body 202 may include transistors and other elements (not shown) as is known in the art. A first intrametal dielectric (IMD) 204, with metal lines 206 of a first metal interconnect level formed therein, is located over semiconductor body 202. Semiconductor body 202 may include additional metal interconnect levels (not shown). A first interlevel dielectric (ILD) 208 is located over IMD 204. A second IMD 210 is located over ILD 208. Trenches 212 are etched in IMD 210 and vias 214 are etched in ILD 208.

Figure 4:
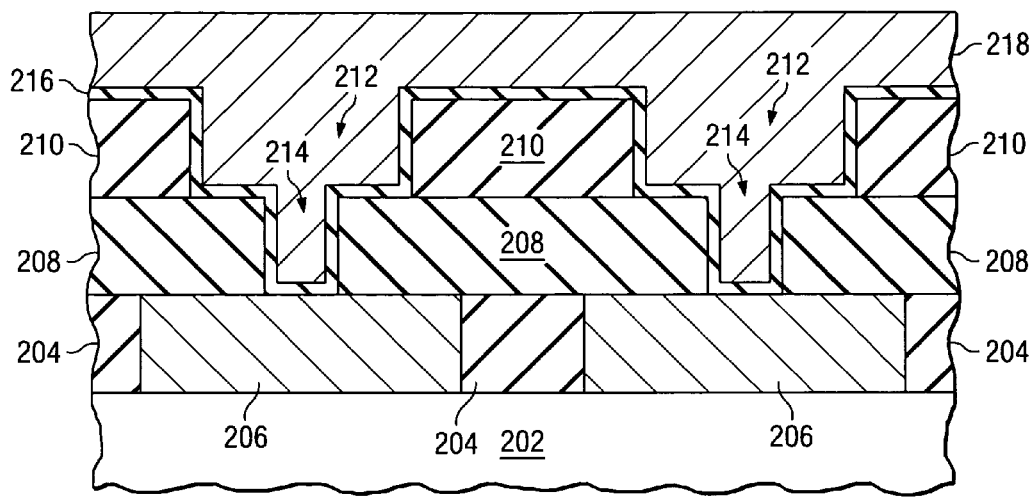

Referring to FIG. 4, a barrier layer 216 and a copper seed layer are deposited over the structure. Suitable barrier layers, such as a Ta/TaN bilayer, are known in the art. Copper 218 is the deposited by electrochemical deposition (ECD) to overfill the trench 212 and vias 214.

Figure 5:
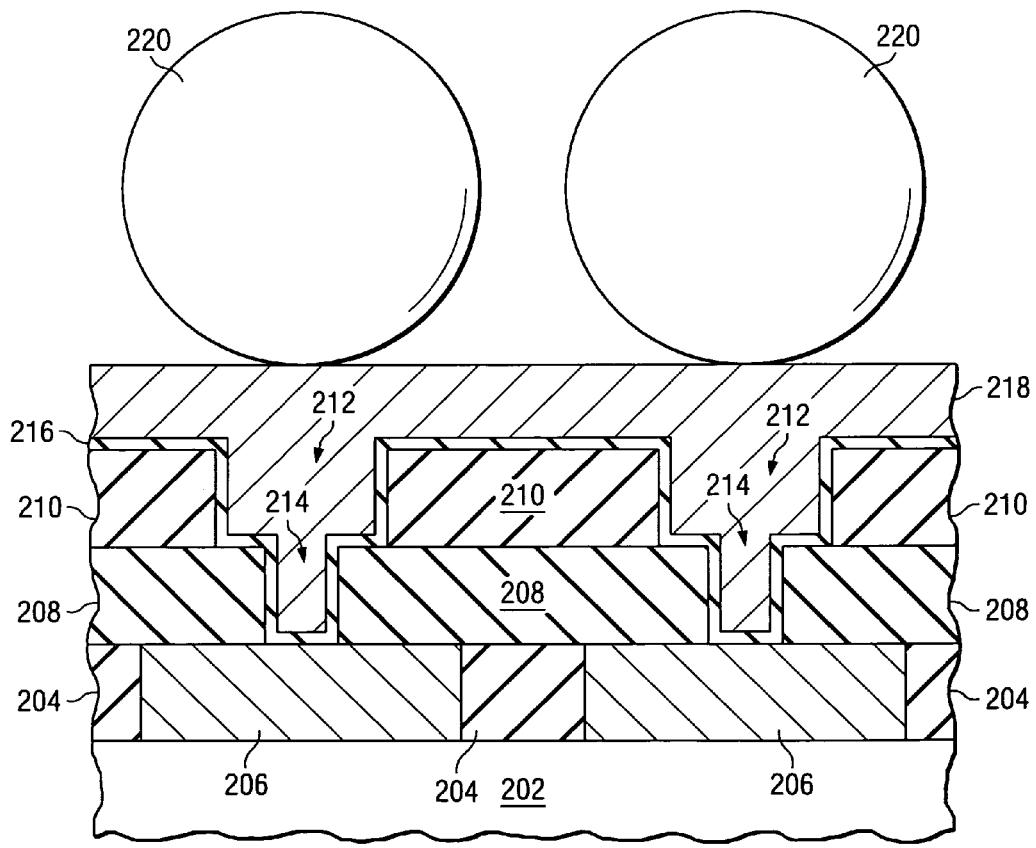
Figure 6:
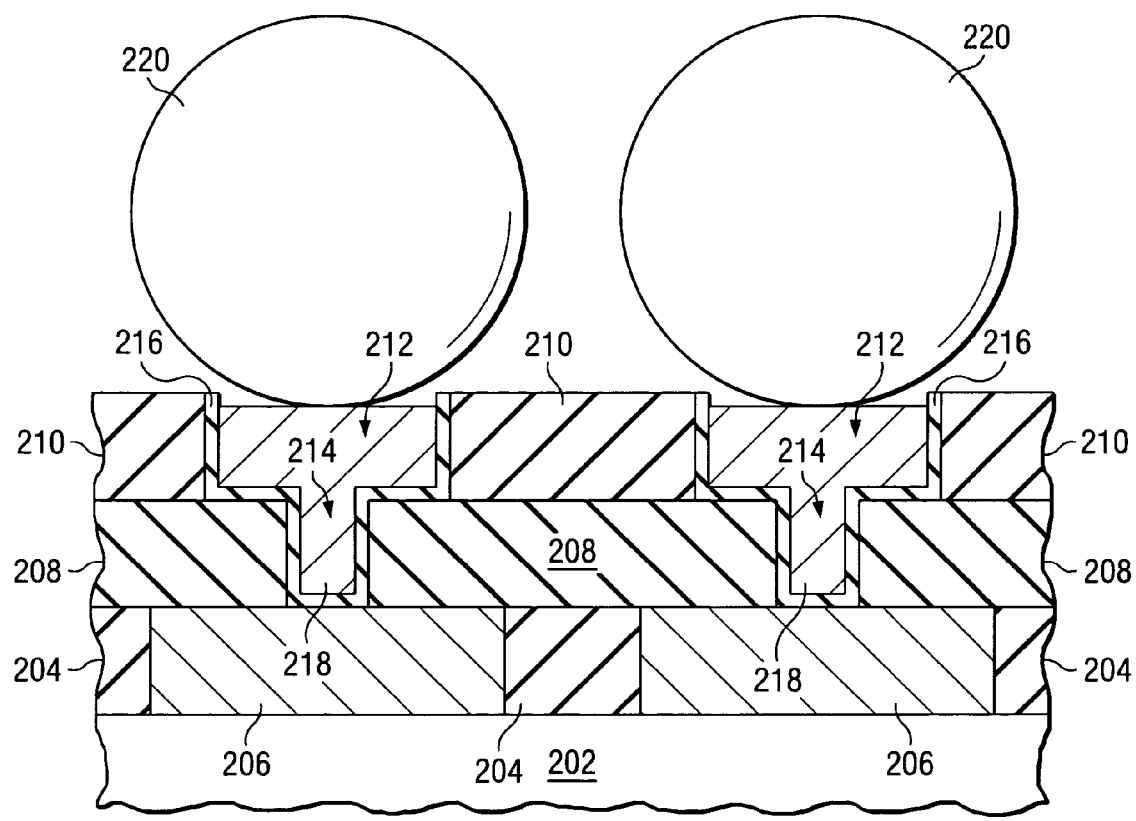

At this point, chemical-mechanical polishing (CMP) is typically used to removed the excess copper and barrier layers. However, in one aspect of the invention, CMP is replaced with an etchback using an etch reactant retained in an at least semi-solid media 220, as shown in FIG. 5. By using a particle size larger than the width of the trench, the excess copper may be removed without removing copper from the trench 212. The term "width" refers to either the width or length of the trench which ever is shorter. The desired etch reactant is retained in the at least semi-solid media as described above an applied to the surface. The excess copper is removed. The etch stops when the etch reactant 220 is no longer in contact with any copper, as shown in FIG. 6. The etch reactant 220 is then removed.

Figure 7:
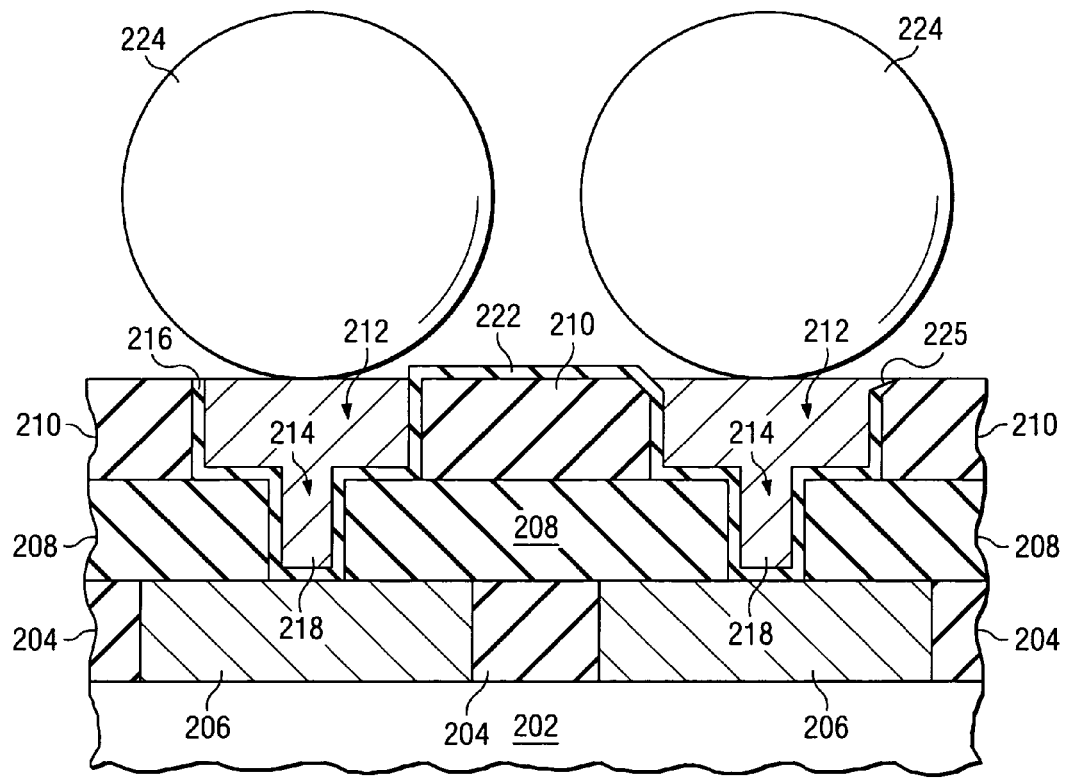
FIGS. 7–8 are cross-sectional diagrams of an embodiment of the invention applied to removing CMP defects at various stages of fabrication
Figure 8:
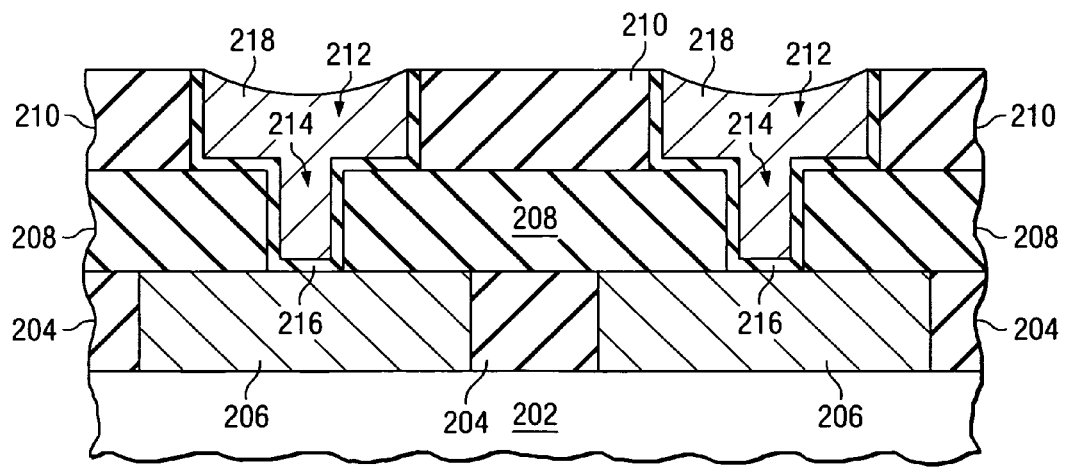

In another aspect of the invention, CMP is performed as usual. However, CMP can leave metal shorts, smearing and eaves. FIG. 7 shows a metal short 222 remaining after CMP. An etch reactant retained in an at least semi-solid media 224 is applied to the surface of the structure. The size of the media 224 is selected to be larger than the width of the trench 212. Accordingly, only a surface layer of copper is removed including metal short 222, as shown in FIG. 8. Due to the size of the etch reactant media 224, the etch reactant does not enter trench 212 and copper 218 remains in the trench. Because the only etching occurs at the surface, metal shorts, smearing, and eaves can be removed. It should be noted that the surface of copper 218 within the trench would be removed to the same depth as the amount of the short/smearing/eave.

It is sometimes desirable to selectively remove a previously formed structure without removing the surrounding structure or underlying layers. This is known as "delayering". Delayering is used, for example, in failure analysis to determine why a device performed as it did. Delayering can also be used to remove a mis-processed layer, thus allowing the mis-processed layer to be replaced and avoid scrapping a lot.

Figure 9:
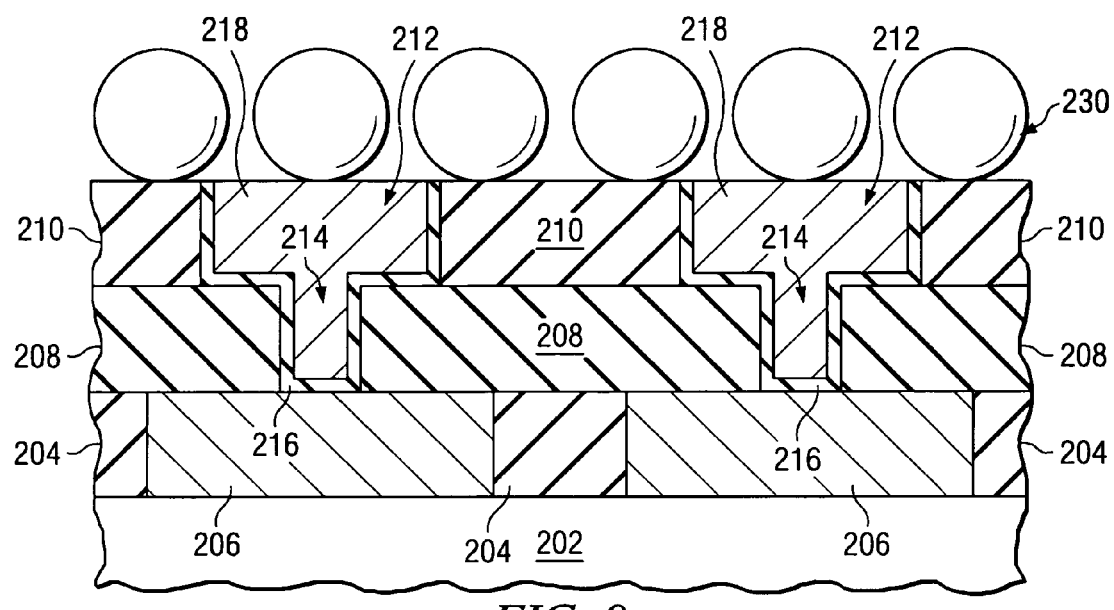
FIGS. 9–10 are cross-sectional diagrams of an embodiment of the invention applied to copper delayering at various stages of deprocessing.
Figure 10:
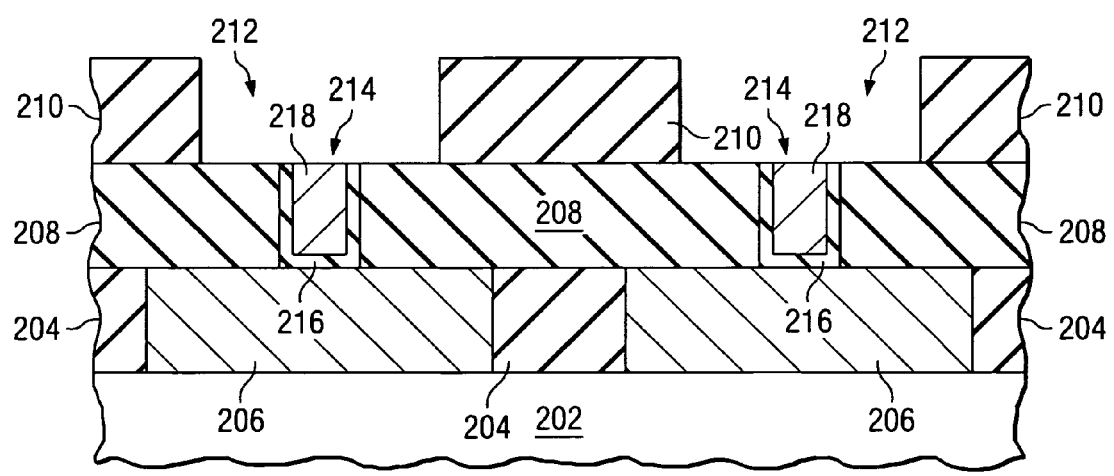

In a third embodiment of the invention, the etch reactant retained in an at least semi-solid media 230 is applied to the surface of the trench 212, as shown in FIG. 9. In this case, the size of the media is selected to be smaller than the width of the trench but larger than the width of the via. This allows delayering of the copper within trench 212, but copper from via 214 is not removed, as shown in FIG. 10. IMD 210 is not removed due to the selectivity of the etch reactants chosen.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

The invention claimed is:

1. An etching method, comprising the steps of:
   retaining an etch reactant within an at least semi-solid media to form an etch reactant media;
   applying the etch reactant media to a surface of a structure to remove a layer at said surface of the structure; and
   removing the etch reactant media.

2. The method of claim 1, wherein said at least semi-solid media comprises an agar solution.

3. The method of claim 1, wherein said at least semi-solid media comprises a gel.

4. An etching method, comprising the steps of:
retaining an etch reactant within an at least semi-solid media of non-liquid or non-gas to form an etch reactant media;
applying the etch reactant media to a surface of a structure; and removing the etch reactant media; wherein said at least semi-solid media comprises a solid.

5. An etching method, comprising the steps of:
retaining an etch reactant within an at least semi-solid media of non-liquid or non-gas to form an etch reactant media:
applying the etch reactant media to a surface of a structure; and
removing the etch reactant media; wherein said structure comprises a semiconductor body which comprises a copper material at the surface thereof and said etch reactant media selectively removes said copper material at said surface.

6. An etching method, comprising the steps of:
retaining an etch reactant within an at least semi-solid media of non-liquid or non-gas to form an etch reactant media;
applying the etch reactant media to a surface of a structure; and
removing the etch reactant media; wherein said applying step removes copper at said surface after a chemical-mechanical polish step.

7. An etching method, comprising the steps of:
retaining an etch reactant within an at least semi-solid media of non-liquid or non-gas to form an etch reactant media;
applying the etch reactant media to a surface of a structure; and
removing the etch reactant media; wherein said applying step removes a metal line at said surface and does not remove a metal via exposed by the removal of the metal line.

8. A method of fabricating an integrated circuit, comprising the steps of:
providing a semiconductor body having an interlevel dielectric layer (ILD) and an intrametal dielectric layer (IMD) formed thereover;
etching a trench in said IMD;
etching a via in said ILD;
filling said trench and via with copper;
applying an etch reactant retained within an at least semi-solid media to a surface of said copper to remove at least a portion of said copper; and
removing said etch reactant retained within an at least semi-solid media.

9. The method of claim 8, further comprising the step of forming said etch reactant within an at least semi-solid media by dicing the at least semi-solid media in to pieces and immersing the pieces in the etch reactant.

10. The method of claim 9, wherein said pieces have a minimum width greater than a width of said via.

11. The method of claim 10, wherein said applying step removes copper from said trench but not substantially from said via.

12. The method of claim 9, wherein said pieces have a minimum width greater than a width of said trench.

13. The method of claim 8, further comprising the step of chemically-mechanically polishing said copper to form a metal line within said trench and wherein said applying step removes one or more of the following: metal shorts, smearing, and eaves.

14. A method for etching a material from a surface of a semiconductor body, comprising the steps of:
providing a semiconductor body having a first material at a surface thereof;
retaining an etch reactant within an at least semi-solid media to create an etch reactant media having a controlled size;
applying said etch reactant media to said surface to remove said first material at said surface, wherein said etch reactant media continues to remove said first material until the controlled size of said etch reactant media prevents the etch reactant media from contacting a portion of said first material below a surface of said surface and exposed during said applying step; and
removing said etch reactant media.

15. The method of claim 14, wherein said semiconductor body further comprises a second material at a surface thereof and wherein said etch reactant is selective against etching said second material.

16. The method of claim 14, wherein said at least semi-solid media comprises an agar solution.

17. The method of claim 14, wherein said at least semi-solid media comprises a gel.

18. The method of claim 14, wherein said at least semi-solid media comprises a solid.

19. The method of claim 14, wherein said first material comprises a metal line and CMP defects and wherein said applying step removes said CMP defects but does not significantly remove said metal line.

20. The method of claim 14, wherein said first material comprises a metal line and an underlying metal via and wherein said applying step removes said metal line but does not significantly remove said metal via.

* * * * *